United States Patent [19]

Iranmanesh

[11] Patent Number: 4,745,087
[45] Date of Patent: May 17, 1988

[54] METHOD OF MAKING FULLY SELF-ALIGNED BIPOLAR TRANSISTOR INVOLVING A POLYSILICON COLLECTOR CONTACT FORMED IN A SLOT WITH AN OXIDE SIDEWALL

[75] Inventor: Ali Iranmanesh, San Antonio, Tex.

[73] Assignee: Advanced Micro Devices, Inc., Sunnyvale, Calif.

[21] Appl. No.: 2,850

[22] Filed: Jan. 13, 1987

[51] Int. Cl.$^4$ ............................................. H01L 21/44
[52] U.S. Cl. ...................................... 437/69; 437/203; 437/33; 437/193; 437/233; 437/162
[58] Field of Search ..................... 357/34, 59 R, 59 H, 357/59 K; 29/591, 578, 580; 148/187, DIG. 122; 156/643, 653, 657; 427/89; 437/203, 33, 31, 193, 233, 162, 69

[56] References Cited

U.S. PATENT DOCUMENTS

| | | | |
|---|---|---|---|
| 3,913,124 | 10/1975 | Roberson | 357/40 |
| 3,956,033 | 5/1976 | Roberson | 357/59 H |
| 4,104,086 | 8/1978 | Bondur et al. | 148/1.5 |
| 4,318,751 | 3/1982 | Horng | 148/187 |
| 4,385,433 | 5/1983 | Ozawa | 29/576 B |
| 4,520,552 | 6/1985 | Arnould et al. | 29/578 |

FOREIGN PATENT DOCUMENTS 0108766 8/1980 Japan ................................ 357/59 R
57-11150 3/1982 Japan.

OTHER PUBLICATIONS

K. Minegishi et al, "A Sub-Micron CMOS Megabit Level Dynamic RAM Technology Using a Doped Face Trench Capacitor Cell", *Proceedings*, IEDM, 1983, p. 319.
T. Morie et al, "Depletion Trench Capacitor Technology for Megabit Level MOSdRAM", *IEEE Electron Device Letters*, vol. EDL-4, No. 11, Nov., 1983, p. 411.
Tak H. Ning et al, "Self-Aligned Bipolar Transistors for High-Performance and Low-Power-Delay VLSI", *IEEE Transactions on Electron Devices*, vol. ED-28, No. 9, Sep., 1981, pp. 1010-1013.
M. Vora et al, "A Sub-100 Picosecond Bipolar ECL Technology", *IEDM*, 1985, pp. 34-37.

*Primary Examiner*—Brian E. Hearn
*Assistant Examiner*—Kevin McAndrews
*Attorney, Agent, or Firm*—Patrick T. King; John P. Taylor; J. Vincent Tortolano

[57] ABSTRACT

An improved method of making a bipolar transistor is disclosed which comprises forming one or more mask layers over a silicon substrate, etching at least one of said one or more masking layers to define a base contact area and a spaced apart collector contact area with an unetched emitter contact area defined in-between, forming a collector slot in a substrate of an integrated circuit structure through the collector contact area defined in the one or more mask layers, oxidizing the sidewall of the collector slot, filling the collector slot and the base and collector contact regions with polysilicon, removing one or more of the mask layers between the polysilicon base and collector contacts, oxidizing the exposed sidewalls of the polysilicon base and collector contacts, forming an emitter contact region between said collector and base contact regions insulated from the base and collector contacts by the sidewall oxidation thereon, and forming a base region in said substrate spaced from the collector slot by the oxide formed on the sidewall of the collector slot.

21 Claims, 6 Drawing Sheets

METHOD OF MAKING FULLY SELF-ALIGNED BIPOLAR TRANSISTOR INVOLVING A POLYSILICON COLLECTOR CONTACT FORMED IN A SLOT WITH AN OXIDE SIDEWALL

BACKGROUND OF THE INVENTION

1. Field of the Invention

This invention relates to an improved method of making a bipolar transistor for an integrated circuit structure. More particularly, this invention relates to a method for making an improved fully self-aligned bipolar transistor.

2. Description of the Prior Art

Conventional bipolar transistors are usually formed with a buried layer leading from the collector region in the substrate to a sinker or vertical doped region which interconnects the buried layer with a collector contact on the surface of the substrate. The sinker is usually separated from the active region of the transistor by a field oxide region typically about 2-4 microns wide.

Typical of such prior art structures are those shown in an article by Vora et al entitled "A Sub100 Picosecond Bipolar ECL Technology" published at pp 34-37 in IEDM in 1985 and in an article by Ning et al entitled "Self-Aligned Bipolar Transistors for High-Performance and Low-Power-Delay VLSI" published at pp 1010-1013 of the IEEE Transactions On Electron Devices, Vol. ED-28, No. 9, September, 1981.

Such a prior art construction is also illustrated in FIG. 1 wherein a buried layer A is formed in a substrate and isolation slots D which extend through buried layer A separate the transistor from other devices in or on the substrate. A collector region F is formed above buried layer A. Above collector region F are intrinsic base region G and extrinsic base region H. An emitter region I above intrinsic base region G is connected to the emitter contact E. Base contact B interconnects with extrinsic base H through a conductive polysilicon layer J. Oxide layer K separates base contact B from emitter contact E.

In such a construction, connection is made between collector region F and collector contact C through buried layer A and a sinker S which usually comprises a portion of the substrate which is highly doped to increase the conductivity of the sinker to provide a low resistance path between the buried layer and the collector contact. To isolate this sinker from the active portions of the device and to prevent or inhibit migration of the dopants in the sinker to the active regions of the device, a portion of the field oxide L is usually formed at LL between sinker S and the active regions. Since field oxide portion LL is usually about 2-4 microns wide, its presence adds considerably to the overall area or footprint occupied by the transistor. Advances in lithography have permitted line width resolution to reach micron dimensions and processing techniques have improved to the point where the reliable formation of thin films and precise etching are both possible so that smaller and more predictable feature sizes can be obtained. As a consequence, the lateral dimensions of devices are reaching micron levels and passing on into nanometer ranges resulting in a continued decrease in the ensuing density of integrated circuits.

Thus, a greater number of individual devices can be fabricated in a given area. While further increases in areal density are likely, physical, equipment, and process limits are being approached. In addition, as devices become smaller and smaller, their power ratings are reduced and the relative importance of problems such as parasitic capacitance and contamination is increased. Due to the diminishing return to be obtained from further efforts to improve areal density, it has become desirable to consider the possibility of increasing the extent of the active regions in the vertical dimension to thereby obtain performance for a device with established lateral dimensions which is equivalent to the performance of a device with greater lateral dimensions. Also higher power or higher performance devices may be obtained in this way.

As the densities of integrated circuits have increased, there has been serious consideration of using trench or slot formation processes for forming the insulating zones between individual transistors. Such an isolation technique is described in Bondur et al U.S. Pat. No. 4,104,086. This isolation technique is also described in Bonn U.S. patent application Ser. No. 719,085 and Gwozdz U.S. patent application Ser. No. 759,621, both of which applications are assigned to the assignee of this application.

Another form of slot isolation is shown in Roberson U.S. Pat. No. 3,913,124 wherein a V shaped isolation slot is formed having isolation oxide formed on the sloped sidewalls with the collector extent or sinker comprising an epitaxial silicon formed to extend down through the middle of one portion of the slot.

In addition to forming slots in semiconductor wafers for isolating individual devices, slots have also been considered for use as passive circuit elements. For example, it has been proposed that a slot be filled with an appropriate material so that it will function as a capacitor. See, e.g., K. Minegishi et al., "A Sub-Micron CMOS Megabit Level Dynamic RAM Technology Using a Doped Face Trench Capacitor Cell", *Proceedings*, IEDM, 1983, p. 319; and T. Morie et al., "Depletion Trench Capacitor Technology for Megabit Level MOSdRAM", *IEEE Electron Device Letters*, v. EDL-4, No. 11, p. 411, Nov. 1983. Such applications are possible because, with appropriate filling materials, a slot can be made to be conductive or insulating as required.

It has also been proposed to construct active devices in slots in a substrate. Fujitsu Japanese Patent Document 57-11150 discloses construction of a lateral bipolar transistor wherein an emitter region is formed by diffusing impurities into the walls of a slot formed in a substrate. A collector region is similarly formed using a slot formed in the substrate near the first slot. The substrate portion between the emitter region slot and the collector region slot is said to form the base of the transistor.

The construction of an active device in slots in a substrate is also disclosed and claimed in Bowers U.S. patent application Ser. No. 576,659, assigned to the assignee of this invention, wherein an emitter slot for a bipolar transistor is formed in a substrate and a base region is diffused into the substrate through the walls of the emitter slot with a collector slot formed in the substrate spaced from the emitter slot and base region.

An integrated circuit structure construction comprising slots having oxide coatings on the upper portions of the walls thereof is shown in Arnold et al U.S. Pat. No. 4,520,552.

A slot collector transistor and the method of forming same are both described and respectively claimed in Iranmanesh et al U.S. patent application Ser. No. 740,361 and Iranmanesh et al U.S. patent application Ser. No. 711,701, both assigned to the assignee of this invention.

SUMMARY OF THE INVENTION

It would be desirable to provide a method of forming a completely self-aligned bipolar transistor of reduced area.

It is therefore an object of this invention to provide a method of making a fully self-aligned slot collector bipolar transistor of reduced area.

It is another object of the invention to provide a method of making a fully self-aligned bipolar transistor of reduced area wherein portions of the emitter, base, and collector contacts are all formed using polysilicon or other conductive material whereby self-aligned contacts are formed to the respective electrodes.

These and other objects of the inventions will be apparent from the following description and accompanying drawings.

In accordance with the invention, a method of making an improved fully self-aligned bipolar transistor comprises forming one or more mask layers over a silicon substrate, etching at least one of said one or more masking layers to define a base contact area and a spaced apart collector contact area with an unetched emitter contact area defined in-between, forming a collector slot in a substrate of an integrated circuit structure through said collector contact area defined in said one or more mask layers, oxidizing the sidewall of said collector slot, filling said collector slot and said base collector contact regions with polysilicon, forming an emitter contact region between said collector and base contact regions, and forming a base region in said substrate spaced from said collector slot by said oxide formed on the sidewall of said slot.

DESCRIPTION OF THE PREFERRED EMBODIMENTS

The fully self-aligned bipolar transistor construction of the invention utilizes formation techniques wherein the openings defining the subsequently formed collector and base contacts are formed at the same time and the space left between the base and collector openings is eventually used to form the emitter contact to ensure self alignment of the respective contacts. In a preferred embodiment, polysilicon is used for the emitter, base, and collector contacts permitting self-aligning techniques to be used for connecting the metal contacts or lines to the device.

Figure 1:
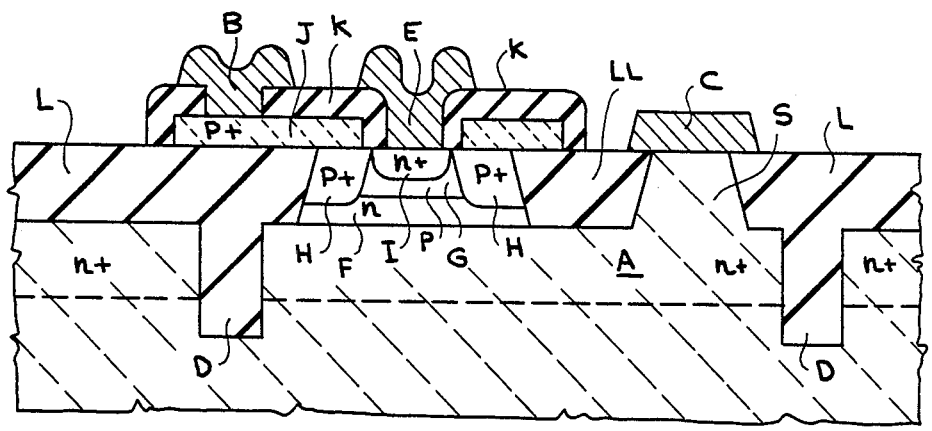
FIG. 1 is a fragmentary vertical cross-sectional view illustrating a typical prior art construction of a bipolar transistor.
Figure 2:
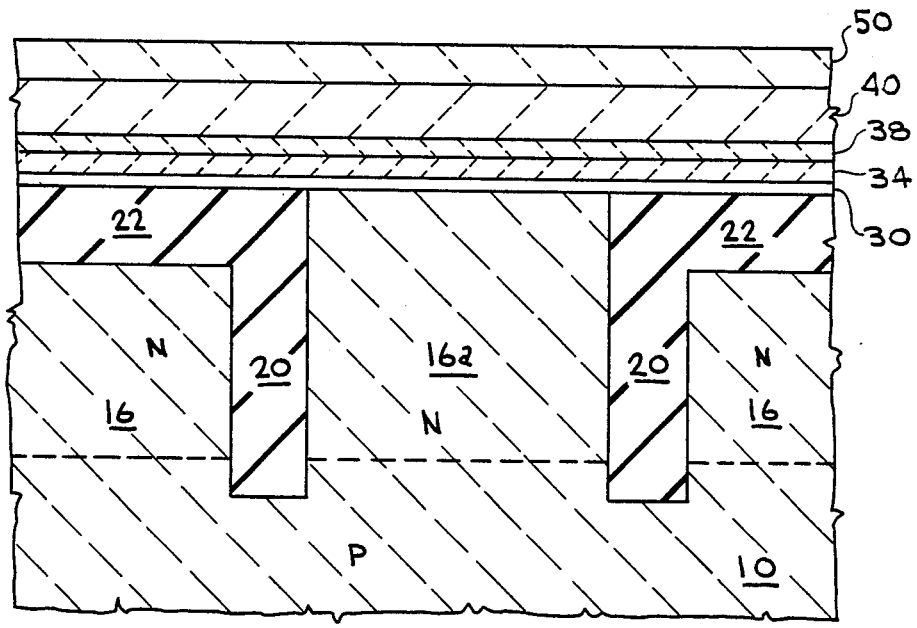
FIG. 2 is a fragmentary vertical cross-sectional view illustrating initial steps in constructing one embodiment of the invention.

The construction of the transistor structure of the invention is illustrated on a step by step basis in FIGS. 2-13. Referring to FIG. 2, a silicon substrate 10 is first implanted with an N type dopant such as, for example, phosphorus to form a collector layer 16, e.g., by implanting the dopant to a depth of about 0.5 micron and then annealing at 1200° C. for about 25 minutes. It should be noted that layer 16 is not a buried collector layer as used in the prior art since no epitaxial layer is formed thereover and the extent of the doping of layer 16 is such to form an N layer rather than an N+ buried collector layer. However, if required, it is possible to use a conventional buried layer formation followed by epitaxial growth of an N type silicon layer.

Isolation oxide slots 20 and field oxide layer 22 are then formed using conventional oxide isolation or slot isolation techniques. The formation of isolation 20, which extends through layer 16 down into the region of substrate 10 below layer 16, isolates a portion 16a of layer 16 as shown in FIG. 2. Portion 16a comprises the area in which the active regions of the bipolar transistor of the invention will be constructed.

After formation of isolation slots 20 and field oxide 22, a barrier oxide layer 30 is formed by heating the structure in oxygen for about 20 minutes at about 1000° C. to form oxide layer 30 having a thickness of about 300 to 500 Å. A thin nitride layer 34 of about 500 to 1500 Å is then formed over barrier oxide layer 30 and then oxidized to form a 100 to 200 Å thick nitride oxide layer 38 thereon.

A further layer 40 of nitride is deposited over layer 38 to a thickness of about 0.2 to 0.3 microns and then an oxide layer 50 of from 0.2 to 0.3 microns thickness is formed over nitride layer 40. It may be necessary to densify oxide layer 50 in order to decrease its etch rate in etchants such as HF or buffered oxide etch (BOE). In such case, the structure may be annealed at about 1000° C. for about 30 minutes to densify layer 50.

While the disclosed embodiment utilizes five mask layers (layers 30, 34, 38, 40, and 50), it should be noted that under some circumstances a lesser number of mask layers may be used, e.g., three mask layers. For example, if nitride mask layer 34 was replaced by another material, oxide layer 30, which prevents stress in the silicon substrate by direct contact with nitride layer 34, could be eliminated. Similarly, layer 38, which provides a convenient etch stop while etching nitride layer 40, could be eliminated if mask layer 34 comprised another material which would also function as an etch stop for the etching of nitride layer 40.

Figure 3:
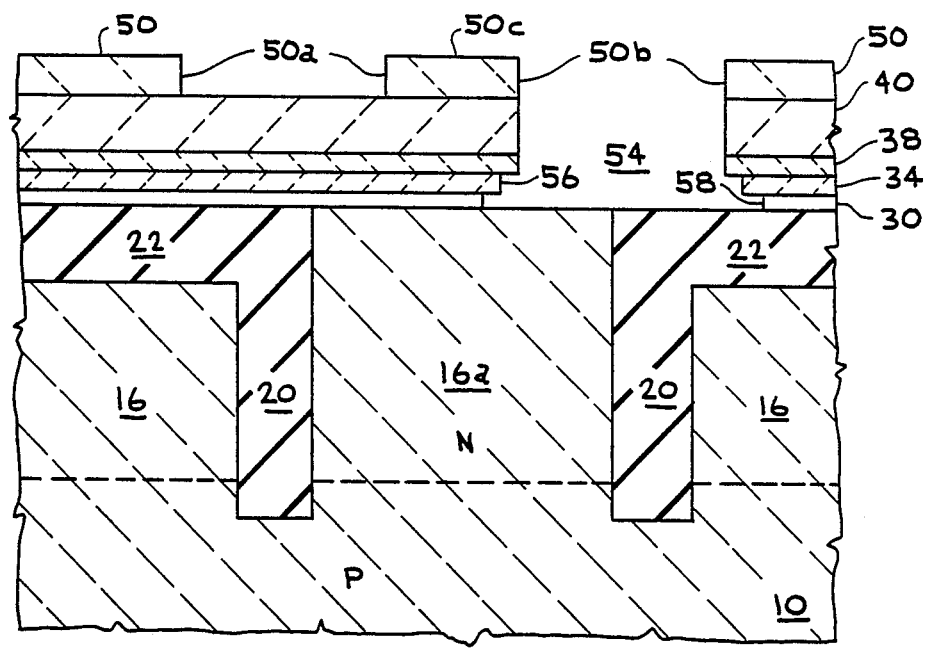
FIGS. 3-11 are fragmentary vertical cross-sectional views illustrating subsequent steps in constructing the same embodiment of the invention as illustrated in FIG. 2.

After formation of nitride mask layer 40 and oxide mask layer 50, oxide layer 50 is then masked and etched at 50a and 50b, in FIG. 3, to respectively define the base and collector areas which will be formed thereunder. It will be further noted that the etching of oxide layer 50 at 50a and 50b leaves an oxide portion 50c thereon in-between the base and collector contact areas which defines the area in which the emitter contact will be subsequently formed. Thus, the self-alignment of the base, collector, and emitter contacts is established early in the construction of the transistor.

The collector contact area is then further defined by masking the previously etched base contact area 50a and then etching 40, 38, 34, and 30 down to collector region 16a and field oxide 22 as shown at 54 in FIG. 3. It will be noted that nitride layer 34 is undercut at 56 by using a wet etch to etch away the exposed portion of nitride layer 34 and barrier oxide layer 30 is also undercut as shown at 58 by also using a wet etch. The purpose of these undercuttings will be explained below.

Figure 4:
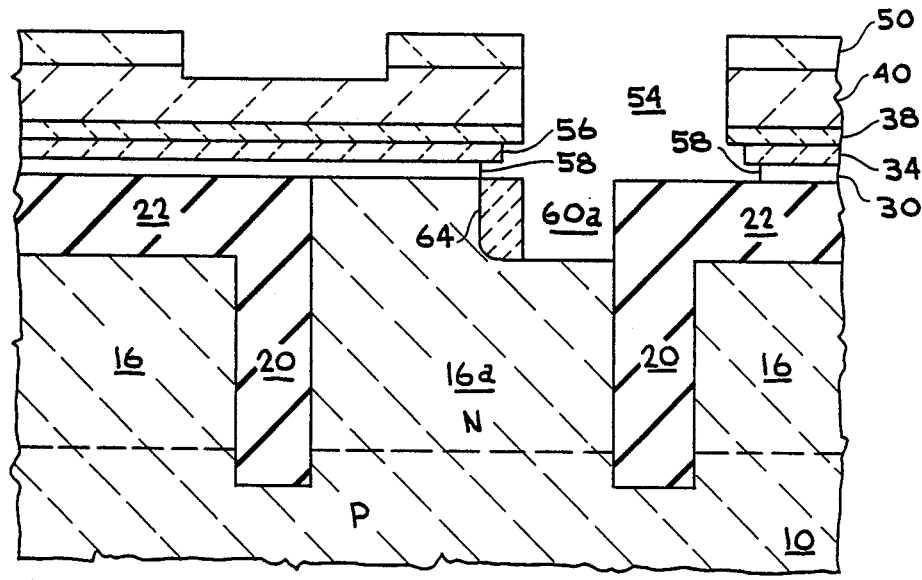

The collector slot is then partially etched, e.g., about 50 to 80% of the total final depth of the slot, into doped portion 16a of substrate 10 as shown at 60a in FIG. 4 using, for example, a reactive ion etch (RIE). The sidewall of slot 60a is then oxidized at 64 and then the rest of collector slot 60 is formed by further anisotropic etching. This further etching serves to extend the depth of slot 60 without disturbing the oxide sidewall 64 as well as serving to remove any oxide from the bottom of the slot and also to expose a portion of the silicon sidewall of the slot below the oxide sidewall 64 as shown in FIG. 5.

Figure 5:
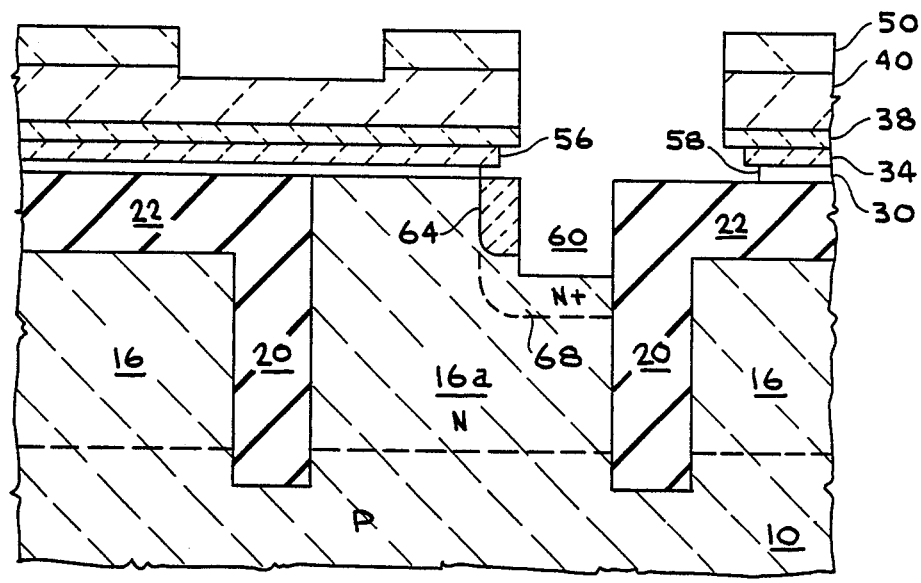

The N+ collector region 68, also shown in FIG. 5, is then formed in layer 16a by doping, for example, with antimony or phosphorus. This may be accomplished by depositing a doped glass, diffusing the desired dopant (contained in the doped glass) into the substrate region 16a by, for example, heating to 1200° C. for about 30 minutes to form doped collector region 68, and then etching the glass away.

Figure 6:
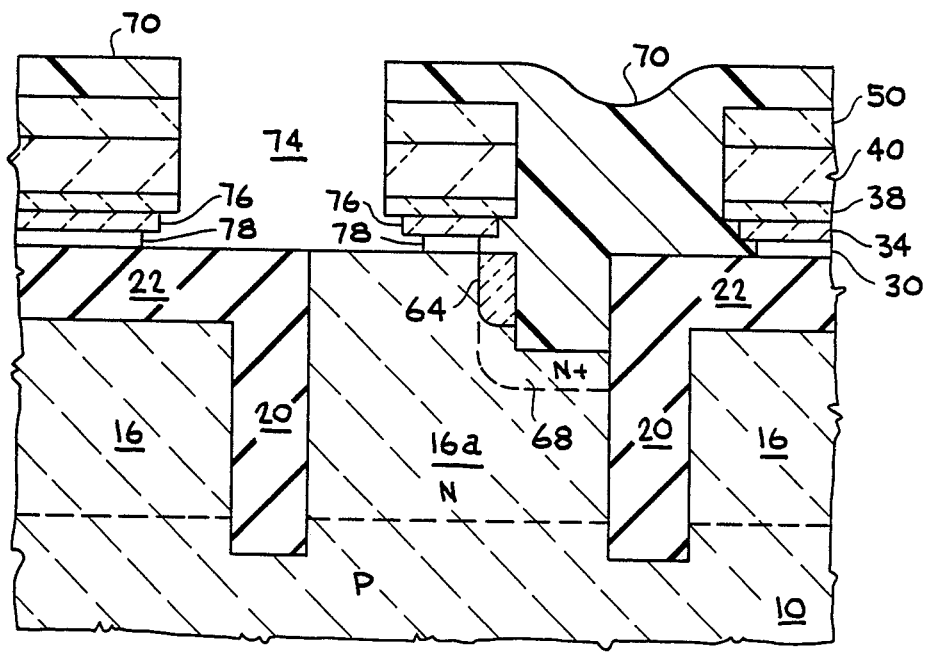

Photoresist layer 70 is then applied to the structure and patterned to permit formation of base contact region 74 by etching of layers 40, 38, 34, and 30 as shown in FIG. 6. As in the etching of nitride layer 34 and barrier oxide layer 30 in forming the collector contact opening, wet etching is used both for nitride layer 34 and barrier oxide layer 30 to provide respective undercutting 76 of nitride layer 34 and undercutting 78 of barrier oxide layer 30.

It must be noted, in this regard, that when etching barrier oxide layer 30, care must be taken to control the amount of the oxide etch since field oxide layer 22 is below barrier oxide layer 30. While etching of some of field oxide layer 22 would not be harmful, field oxide layer 22 should not be etched much, i.e., not more than about 10% of its total thickness, because the base to collector capacitance will increase as the thickness of field oxide layer 30 is decreased.

Figure 7:
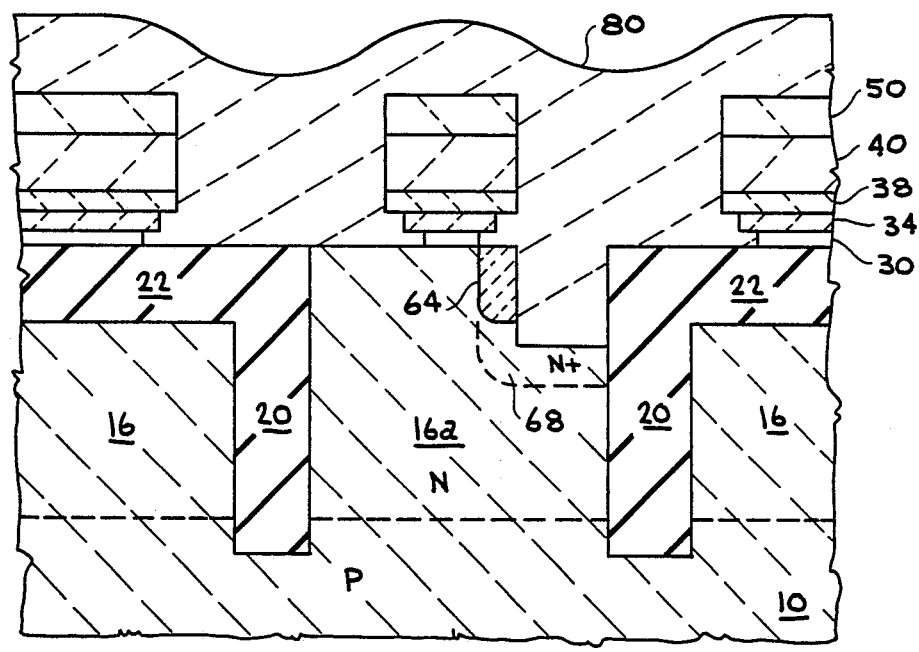

After formation of base contact opening 74, photoresist layer 70 is removed and, in a preferred embodiment, a layer of polysilicon 80 may be applied over the structure, filling both base contact opening 74 and collector slot 60 as seen in FIG. 7.

Figure 8:
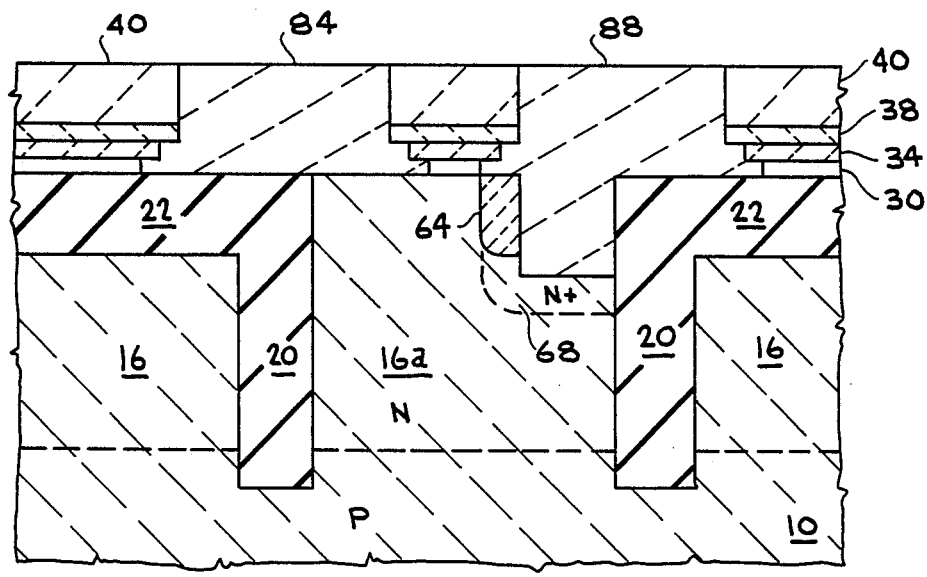

Polysilicon layer 80 is then planarized using dry etching or mechanical polishing techniques to bring the level of polysilicon layer 80 down to the level of layer 40 leaving a base polysilicon contact plug 84 and a collector polysilicon contact plug 88 as shown in FIG. 8. Oxide layer 50 is also removed during the planarization process using either the dry etching or mechanical polishing techniques used to planarize polysilicon layer 80 or by combining same with wet etching to remove oxide 50. While a lower portion of polysilicon collector contact plug 88 fills collector slot 60 and the upper portion of the contact occupies the space denoted as 54 in FIG. 4, for simplicity the contact plug will be hereinafter denoted in its entirety as 88.

It will be noted that both polysilicon contact plugs 84 and 88 are in contact with the underlying silicon substrate and also partially extend over oxide layer 22. The provision of oxide layer 22 beneath the initially formed polysilicon layer 80 permits the remaining polysilicon, i.e., plugs 84 and 88, to not only function as contacts for the individual elements of the transistor but also to form bridges or contact lines to adjacent devices in the substrate as well.

Figure 9:
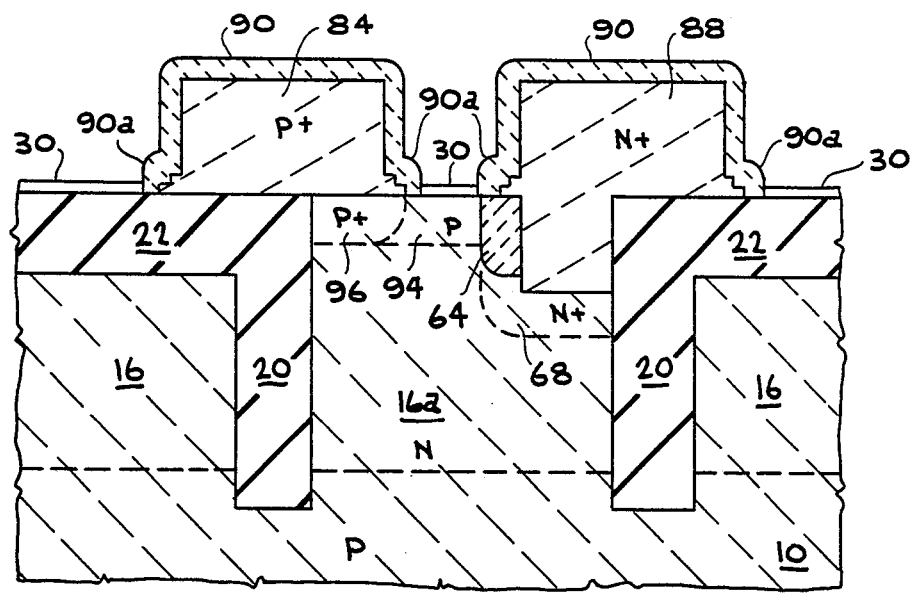

The structure is then masked to permit N+ doping of polysilicon collector plug 88, for example, with phosphorus, and then again masked to permit P+ doping of base polysilicon plug 84, for example, with boron. The P+ dopant in polysilicon plug 84 is later diffused into region 16a in the substrate forming extrinsic base region 96 in electrical contact with polysilicon plug 84. If desired, collector region 68 may be formed at the same time by diffusing the N+ dopant in plug 88 into the substrate as shown in FIG. 9.

The remaining portions of nitride layer 40 are then removed followed by removal of the remainder of nitride oxide layer 38. While, as illustrated, nitride layer 40 may be completely removed at this point, it is also possible to only remove those portions of layers 38 and 40 which overlie the emitter regions, leaving it elsewhere, if desired. Removal of nitride layer 40 at least in the emitter region now exposes portions of the side walls of polysilicon base plug 84 and collector plug 88. These areas, as well as the tops of the polysilicon plugs 84 and 88, are then oxidized to form oxide portions 90 as shown in FIG. 9. High pressure oxidation (HIPOX) is preferred because it is done in smaller diffusion constant time and does not diffuse junctions.

The additional polysilicon present due to the undercutting of nitride layer 34 at 56 and 76 and the undercutting of barrier oxide layer 30 at 58 and 78 results in the formation of a bulge of oxide at 90a which, in turn, will narrow the opening to the underlying substrate and therefore shrink the size of the emitter region which will be formed in substrate 16a as will be described below. This, in turn, will inhibit contact between emitter region 98 and extrinsic base region 96 by shrinking the size of emitter region 98. This additional polysilicon also reduces the encroachment of oxide under the emitter nitride. However, the additional polysilicon may be etched away if required.

The thin nitride layer 34 is then removed leaving only barrier oxide layer 30. The intrinsic base region 94 is now formed in silicon substrate region 16a, as shown in FIG. 9, by implantation of P+ dopant such as boron followed by annealing, for example, at about 900° C. for about 15 minutes. It should be noted, however, that the intrinsic base may be implanted before oxidizing the polysilicon. However, if the intrinsic base is implanted first, then the oxidation of the polysilicon is preferably done using HIPOX techniques to keep the intrinsic base shallow.

Figure 10:
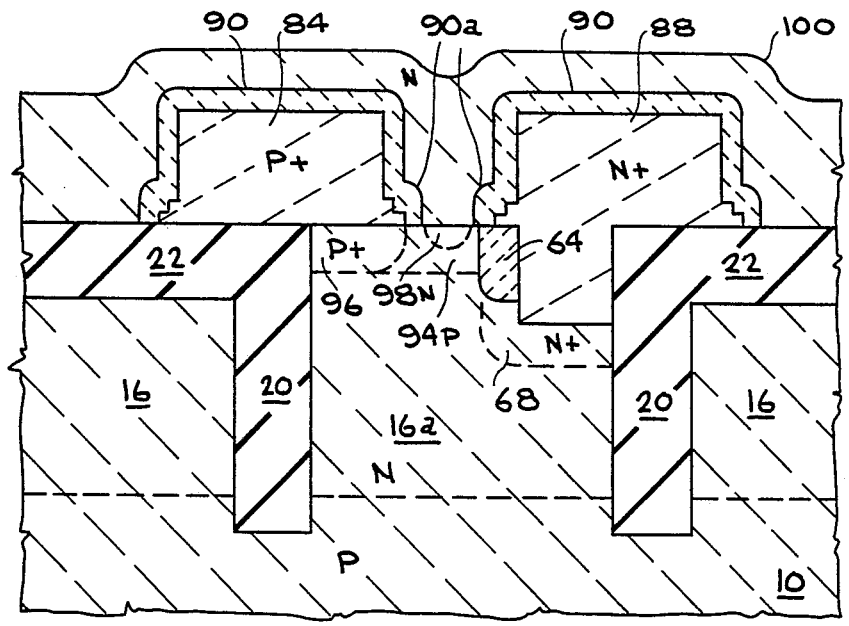
Figure 11:
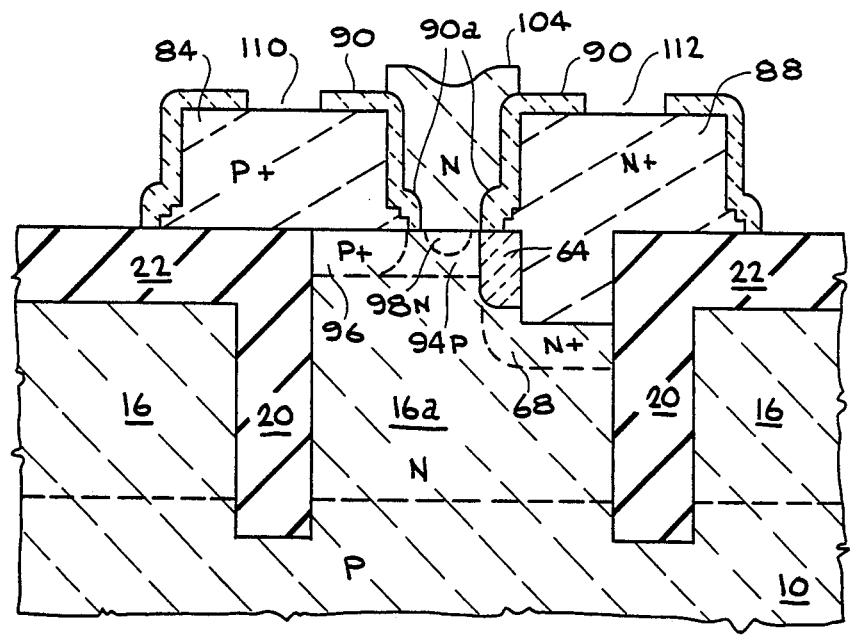
Figure 12:
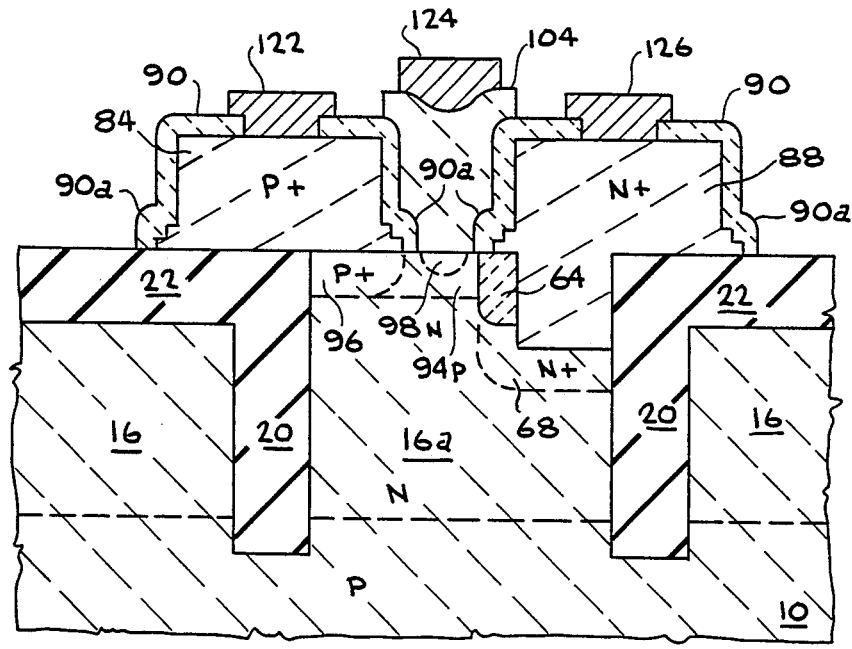
FIG. 12 is a fragmentary vertical cross-sectional view of the embodiment of the invention constructed by the steps illustrated in FIGS. 1-11.

After formation of intrinsic base region 94, barrier oxide layer 30 is removed, e.g., by etching, in preparation for formation of the emitter and emitter contact. Emitter region 98 may be formed either by direct implantation of an N dopant such as arsenic into intrinsic base region 94 in silicon substrate portion 16a or, preferably, by first forming a polysilicon emitter contact as illustrated in FIGS. 10-12. As seen in FIG. 10, an N doped polysilicon layer 100, e.g., a polysilicon layer doped with arsenic, is formed over the structure and then annealed to diffuse the N dopant into the surface of intrinsic base region 94 to form emitter region 98 therein.

Polysilicon layer 100 is then masked and etched to form polysilicon emitter contact plug 104 which is electrically separated or insulated from polysilicon base contact plug 84 and polysilicon collector contact plug 88 by oxide 90 and 90a on the sidewalls thereof as seen in FIGS. 11 and 12.

Still referring to FIG. 11, contact openings 110 and 112 are then respectively cut through oxide 90 on the top of polysilicon plugs 84 and 88 to form the self-aligned base and collector contacts. Alternatively, a further oxide layer could be first applied and planarized followed by opening of the contacts to the respective polysilicon contact plugs.

A layer of metal 120 such as aluminum is then applied and masked to form the metal contacts or lines 122, 124 and 126 respectively to the polysilicon base, emitter, and collector contacts to provide the final structure as shown in FIG. 13.

The resultant improved bipolar transistor has a reduced area which may be as small as half the size of a prior art bipolar transistor due to elimination of the field oxide usually present between the active area and the prior art collector sinker as well as elimination of sinker diffusion. This results in significant improvement in the speed and density of the devices. Furthermore, elimination of the buried layer as well as the epitaxial layer reduce the number of defects and contribute to considerable cost advantage over existing prior art technologies.

The method of forming the initial opening to the base and collector contact regions and definition of the emitter contact region therebetween results in a self-aligned transistor construction which permits a compact construction and spacing of the transistor elements.

The use of polysilicon for the base, emitter, and collector contacts permits self-alignment techniques to be utilized to make connection to the polysilicon plugs or contacts from metal contacts or lines over the polysilicon and oxide layers thereon, thus further reducing the space requirements of the device. The use of polysilicon for the collector contact also provides the possibility of high reverse current gain whenever required, while the use of polysilicon for the emitter contact increases the gain of the device. The extension of the polysilicon contacts over the oxide regions respectively adjacent the base and collector contacts permits interconnection to adjacent transistor elements formed in the same integrated circuit substrate.

Having thus described the invention, what is claimed is:

1. An improved method of making a fully self-aligned bipolar transistor comprising:
   (a) forming one or more mask layers over a silicon substrate;
   (b) etching at least one of said one or more masking layers to define a base contact area and a spaced apart collector contact area with an unetched emitter contact area defined in between;
   (c) masking said base contact area;
   (d) forming a collector slot in a substrate of an integrated circuit structure through said collector contact area defined in said one or more mask layers;
   (e) oxidizing the sidewall of said collector slot;
   (f) forming a deeper portion of said collector slot after oxidizing said collector slot sidewall;
   (g) forming a collector region in said substrate through the wall of said collector slot below said oxidized collector slot sidewall;
   (h) filling said collector slot and said base and collector contact regions with polysilicon;
   (i) forming an emitter contact region between said collector and base contact regions; and
   (j) forming a base region in said substrate spaced from said collector slot by said oxide formed on the sidewall of said slot.

2. The method of claim 1 wherein said step of filling said collector and base contact regions with polysilicon comprise the further steps of forming a polysilicon layer over said substrate and in said slot and said contact regions; and planarizing said structure sufficiently to remove portions of said polysilicon layer above said one or more mask layers to form a polysilicon collector contact portion above and in said collector slot and a polysilicon base contact portion spaced from said collector contact portion.

3. The method of claim 2 including the further step of forming an extrinsic base region in said substrate below said base contact portion.

4. The method of claim 3 including the further step of forming an intrinsic base region in said substrate between said extrinsic base region and said oxide sidewall of said collector slot.

5. The method of claim 4 including the further step of forming an emitter region in the surface of said intrinsic base region in said substrate.

6. The method of claim 5 including the further steps of removing at least some of the portions of said one or more masking layers adjacent said polysilicon base and collector contacts, forming an insulation layer on the sidewalls of said polysilicon base and collector contact portions, and forming an emitter contact over said emitter region insulated from said base and collector contacts by said sidewall insulation.

7. The method of claim 6 wherein said step of forming an emitter contact comprises forming a polysilicon emitter contact.

8. The method of claim 7 wherein said step of forming a polysilicon emitter contact further comprises forming a second layer of polysilicon over said emitter region and patterning said polysilicon layer to form said polysilicon emitter contact.

9. The method of claim 8 wherein said second polysilicon layer comprises a doped polysilicon and said emitter region is formed in the surface of said intrinsic base region by diffusing dopant from said second polysilicon layer into said intrinsic base region.

10. The method of claim 9 including the further steps of forming an insulating layer over at least said polysilicon base and collector contacts and opening self-aligned contacts to at least said base and collector contacts through said oxide layer formed over said contact portions.

11. A method of making a fully self-aligned bipolar transistor having a slot collector separated from the active portions of said transistor by oxide formed on the wall of said collector slot which comprises:
   (a) forming one or more mask layers over a silicon substrate;
   (b) etching at least one of said one or more masking layers to define a base contact area and a spaced apart collector contact area;
   (c) forming a collector slot in said substrate through said collector contact area defined in said one or more mask layers;
   (d) oxidizing the sidewall of said partially formed collector slot;
   (e) forming a deeper portion of said slot;
   (f) doping said substrate through the bottom portions of said slot below the oxidized sidewall of said slot to formed a doped collector region in said substrate;
   (g) filling said slot and said base contact area and said collector contact area in said one or more mask layers with polysilicon;
   (h) removing at least that portion of said one or more mask layers remaining on said substrate between said collector contact region and said base contact region to leave a polysilicon collector contact on said substrate over said slot and a polysilicon base contact over said substrate spaced from said collector contact;

(i) oxidizing the sidewalls of said polysilicon base and collector contacts exposed by said removal of said one or more mask layers;

(j) forming an extrinsic base region in said substrate below said base contact;

(k) forming an intrinsic base region in said substrate between said extrinsic base region and said oxide sidewall of said collector slot;

(l) forming an emitter region in said substrate in the surface of said intrinsic base region; and (m) forming an emitter contact above said emitter region in said substrate, said emitter contact being separated from said base and collector contacts by said oxide formed on the sidewalls of said base and collector contacts.

12. The method of claim 11 wherein said step of forming said intrinsic base region in said substrate between said extrinsic base region and said oxide sidewall of said collector slot further comprises the step of forming said intrinsic base region between said polysilicon base contact and said polysilicon collector contact using said contacts as masks to provide alignment for said intrinsic base region with respect to said base and collector contacts.

13. The method of claim 12 wherein said step of forming an emitter region in said substrate in the surface of said intrinsic base region further comprises implanting dopant into the surface of said intrinsic base region to form said emitter region.

14. The method of claim 13 wherein said step of forming said emitter contact above said emitter region further comprises the steps of removing any remaining mask materials and oxide formed during oxidation of said polysilicon base and collector contact sidewalls; and then filling said opening between said polysilicon base and collector contacts with polysilicon to form said emitter contact.

15. The method of claim 12 wherein said emitter region is formed by the steps of removing any remaining mask materials and oxide formed during oxidation of said polysilicon base and collector contact sidewalls; filling said opening between said polysilicon base and collector contacts with polysilicon to form said emitter contact; and diffusing dopant in said polysilicon emitter contact into said substrate to form said emitter region in the surface of said intrinsic base region.

16. A method of making a fully self-aligned bipolar transistor in an integrated circuit structure having a polysilicon emitter contact separated from polysilicon collector and base contacts of said transistor by oxide formed on the sidewalls of said polysilicon collector and base contacts which comprises:

(a) forming a first mask layer over a silicon substrate comprising a first mask material differing from said silicon substrate;

(b) forming a second mask layer over said first mask layer comprising a mask material different from said first mask layer;

(c) forming a third mask layer over said second mask layer comprising a material different than said second mask layer;

(d) forming a fourth mask layer over said third mask layer comprising a material different from said third mask layer;

(e) etching said fourth mask layer to define a base contact area and a spaced apart collector contact area;

(f) masking said base contact area exposed through said fourth mask and then removing exposed portions of said third second and first mask layers to define a collector contact region above said silicon substrate;

(g) forming a collector slot in said substrate through said collector contact area defined in said mask layers;

(h) oxidizing the silicon substrate sidewall of said partially formed collector slot;

(i) forming a deeper portion of said slot;

(j) doping said silicon substrate through the bottom portions of said slot below the oxidized sidewall of said slot to formed a doped collector region in said substrate;

(k) masking said collector contact region to expose said base contact opening formed in said fourth mask layer;

(l) removing portions of said underlying third, second, and first mask layers exposed by said base contact opening in said fourth mask layer;

(m) removing said mask over said collector contact region and filling said base contact region and said collector contact region, including said collector slot, with polysilicon;

(n) planarizing said polysilicon to remove any polysilicon above said third mask layer;

(o) removing at least said portion of said third and second mask layers between said polysilicon base contact and said polysilicon collector contact;

(p) oxidizing the sidewalls of said polysilicon base and collector contacts exposed by said removal of said second and third mask layers;

(q) forming an extrinsic base region in said silicon substrate below said polysilicon base contact;

(r) forming an intrinsic base region in said substrate by implanting a dopant into said substrate through said first mask layer between said polysilicon base and collector contacts;

(s) removing said first mask layer above said intrinsic base region;

(t) depositing polysilicon into said area between said polysilicon base contact and said polysilicon collector contact to form a polysilicon emitter contact separated and insulated from said polysilicon base and collector contacts by the oxidized sidewalls of said polysilicon base and collector contacts; and (u) forming an emitter region in said substrate in the surface of said intrinsic base region by diffusing dopant into the surface of said intrinsic base region in said substrate from said polysilicon emitter contact.

17. The method of claim 16 including the further steps of forming field oxide portions on said substrate prior to forming said mask layers, said field oxide portions defining an opening to said substrate in said field oxide portions having a width less than the combined width of said base, collector, and emitter contacts regions; and forming said initial openings in said fourth mask for said base and collector contact regions in registry with said opening between said field oxide portions whereby a respective portion of said collector and base contact regions will be formed over said field oxide portions to permit connection by said collector and base contacts to other portions of said integrated circuit structure.

18. The method of claim 16 wherein said step of forming said first mask layer over said silicon substrate comprises forming a 300 to 500 Å barrier oxide layer and forming a 500 to 1500 Å nitride layer over said barrier oxide layer.

19. The method of claim 18 wherein said step of forming said second mask layer comprises oxidizing the surface of said nitride layer of said first mask layer to form a nitride oxide layer.

20. The method of claim 19 wherein said step of forming said third mask layer comprises applying a 0.2 to 0.3 micron nitride layer over said second mask layer.

21. The method of claim 20 wherein said step of forming said fourth mask layer comprises forming a 0.2 to 0.3 micron oxide layer over said third mask layer.

* * * * *